(12) United States Patent
Petrovic et al.

(10) Patent No.: US 8,773,966 B1
(45) Date of Patent: Jul. 8, 2014

(54) SIGNAL POWER MEASUREMENT AND AUTOMATIC GAIN CONTROL IN ORTHOGONAL FREQUENCY DIVISION MULTIPLE ACCESS SYSTEMS

(75) Inventors: Vladan Petrovic, San Jose, CA (US); Manyuan Shen, Milpitas, CA (US); Qing Zhao, Milpitas, CA (US); Leilie Song, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 561 days.

(21) Appl. No.: 13/101,628

(22) Filed: May 5, 2011

Related U.S. Application Data (60) Provisional application No. 61/332,601, filed on May 7, 2010.

(51) Int. Cl.
*H04W 52/04* (2009.01)
*H04W 52/52* (2009.01)
*H04B 1/69* (2011.01)
*G06F 17/14* (2006.01)

(52) U.S. Cl.
CPC .............. *H04W 52/04* (2013.01); *H04W 52/52* (2013.01); *H04B 1/69* (2013.01); *G06F 17/142* (2013.01)
USPC ............................ 370/203; 370/208; 370/210

(58) Field of Classification Search
CPC ........ H04W 52/04; H04W 52/52; H04B 1/69; G06F 17/14; G06F 17/142
USPC ........................................... 370/203, 208, 210
See application file for complete search history.

(56) References Cited

U.S. PATENT DOCUMENTS

| | | | | |
|---|---|---|---|---|
| 8,494,097 | B1 * | 7/2013 | Lee et al. | 375/345 |
| 8,548,105 | B2 * | 10/2013 | Rimini | 375/345 |
| 2002/0177446 | A1 * | 11/2002 | Bugeja et al. | 455/450 |
| 2008/0101212 | A1 * | 5/2008 | Yu et al. | 370/208 |
| 2008/0176595 | A1 * | 7/2008 | Karaoguz | 455/552.1 |
| 2009/0213919 | A1 * | 8/2009 | Park et al. | 375/227 |
| 2010/0322326 | A1 * | 12/2010 | Arambepola et al. | 375/260 |
| 2013/0101057 | A1 * | 4/2013 | Razazian et al. | 375/258 |
| 2013/0114519 | A1 * | 5/2013 | Gaal et al. | 370/329 |

* cited by examiner

*Primary Examiner* — Farah Faroul (57) ABSTRACT

A receiver of a wireless communication device, the receiver including a fast Fourier transform module, a first power measuring module, and a gain control module. The fast Fourier transform module is configured to convert a signal from a time domain to a frequency domain. The signal includes a plurality of reference signals. The reference signals have a predetermined power. The first power measuring module is configured to generate a first power measurement of the signal in the frequency domain based on the plurality of reference signals. The gain control module is configured to adjust a gain of the receiver based on the first power measurement.

20 Claims, 9 Drawing Sheets

SIGNAL POWER MEASUREMENT AND AUTOMATIC GAIN CONTROL IN ORTHOGONAL FREQUENCY DIVISION MULTIPLE ACCESS SYSTEMS

CROSS-REFERENCE TO RELATED APPLICATIONS

This application claims the benefit of U.S. Provisional Application No. 61/332,601, filed on May 7, 2010. The disclosure of the above application is incorporated herein by reference in its entirety.

FIELD

The present disclosure relates generally to communication systems and more particularly to signal power measurement and automatic gain control in orthogonal frequency division multiple access (OFDMA) systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In many communication systems, transmitters encode and modulate signals before transmission, and receivers demodulate and decode received signals. Many receivers use some form of automatic gain control to adjust gain of one or more receiver components so that the received signals can be correctly demodulated and decoded.

SUMMARY

A receiver of a wireless communication device, the receiver including a fast Fourier transform module, a first power measuring module, and a gain control module. The fast Fourier transform module is configured to convert a signal from a time domain to a frequency domain. The signal includes a plurality of reference signals. The reference signals have a predetermined power. The first power measuring module is configured to generate a first power measurement of the signal in the frequency domain based on the plurality of reference signals. The gain control module is configured to adjust a gain of the receiver based on the first power measurement.

A method for a receiver of a wireless communication device, the method including converting a signal received by the receiver from a time domain to a frequency domain. The signal includes a plurality of reference signals. The reference signals have a predetermined power. The method further includes generating a first power measurement of the signal in the frequency domain based on the plurality of reference signals and adjusting a gain of the receiver based on the first power measurement.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure relates to an automatic gain control in a receiver of a wireless device, where the receiver sets the gain of receiver components based on signal power measured in the frequency domain. Specifically, the automatic gain control measures the signal power in frequency domain based on reference signals (pilots) included in a received sub-frame. At the end of the sub-frame, the automatic gain control adjusts the gain of the receiver components according to the measured signal power. The receiver processes the subsequent sub-frame according to the adjusted gain. While the automatic gain control measures the signal power in frequency domain during a sub-frame, the automatic gain control adjusts the gain of the receiver components according to the measured signal power at a sub-frame boundary that follows.

Figure 1:
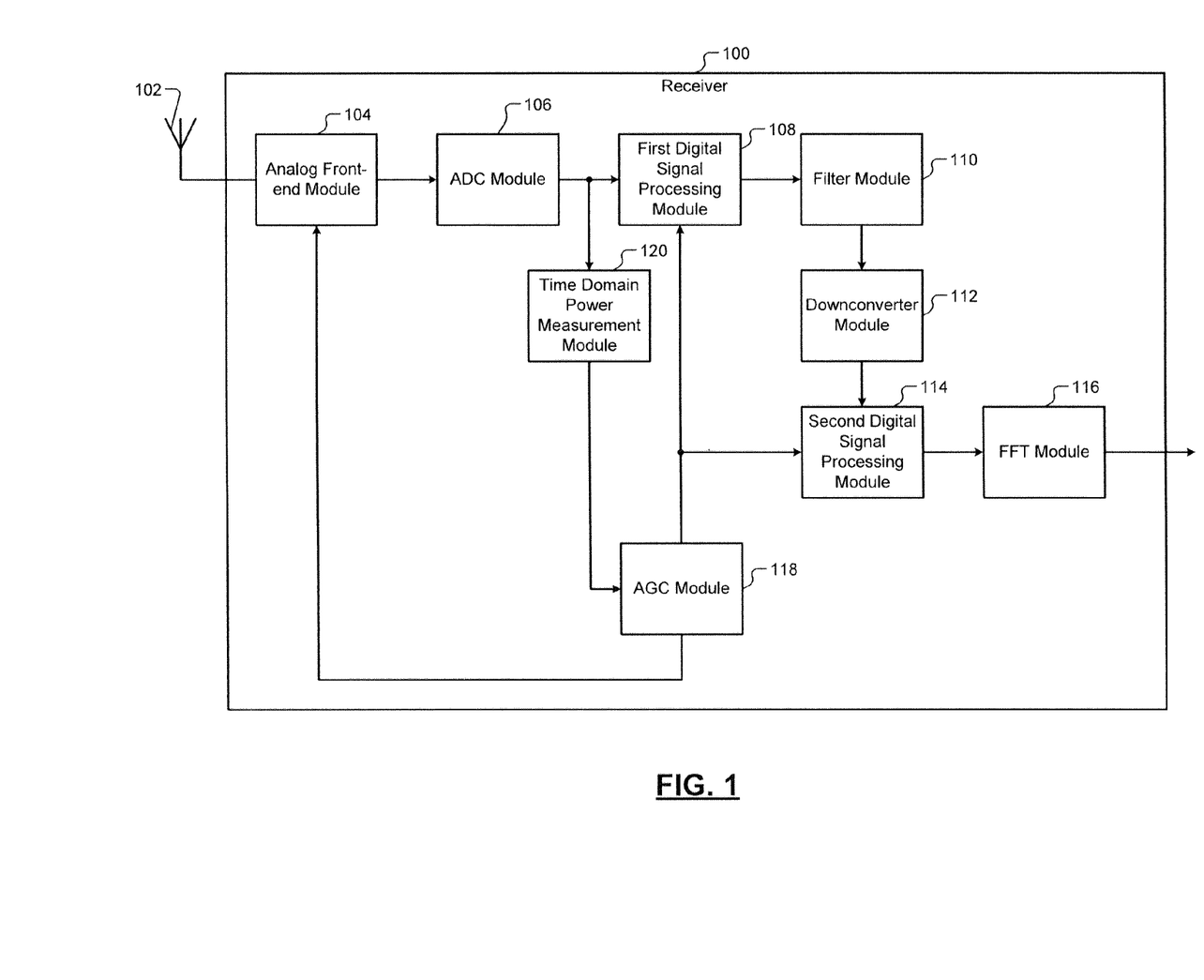
FIG. 1 is a functional block diagram of a receiver of a wireless communication device, where the receiver sets a gain of one or more receiver components based on signal power measured in the time domain.

Referring now to FIG. 1, a receiver 100 of a wireless communication device is shown. The receiver 100 uses AGC to set gain of the receiver components according to signal power measured in the time domain. The receiver 100 includes an antenna 102, an analog front-end (AFE) module 104, an analog-to-digital converter (ADC) module 106, a first digital signal processing (DSP) module 108, a filter module 110, a downconverter module 112, a second DSP module 114, a fast Fourier transform (FFT) module 116, an automatic gain control (AGC) module 118, and the time domain (TD) power measurement module 120. The receiver 100 receives signals via the antenna 102. Although one antenna is shown, the receiver 100 may include a plurality of antennas. For example, the plurality of antennas may be arranged in a multiple-input multiple-output (MIMO) configuration.

The AFE module 104 processes the signals received via the antenna 102. For example, the AFE module 104 may demodulate the signals received via the antenna 102. The ADC module 106 converts an output of the AFE module 104 from analog to digital format. The first DSP module 108 processes an output of the ADC module 106. The filter module 110 filters an output of the first DSP module 108. For example, the filter module 110 may include a low-pass filter module.

The downconverter module 112 downconverts an output of the filter module 110. The second DSP module 114 processes an output of the downconverter module 112. The FFT module 116 converts an output of the second DSP module 114 from the time domain to frequency domain. An output of the FFT module 116 is further processed by other modules (not shown) of the receiver 100 in frequency domain. For example, a channel estimation module (not shown) of the receiver 100 may generate a channel estimate based on the output of the FFT module 116.

The AGC module 118 controls the gain of the AFE module 104, the first DSP module 108, and the second DSP module 114. The TD power measurement module 120 measures the signal power of the received signals in the time domain and outputs the signal power measurement to the AGC module 118. The AGC module 118 adjusts the gain of the AFE module 104, the first DSP module 108, and the second DSP module 114 based on the signal power measurement in the time domain.

In systems such as Worldwide Interoperability for Microwave Access (WiMAX) systems using orthogonal frequency division multiplexing (OFDM), data are transmitted in frames. Each frame includes a plurality of OFDM symbols. A first OFDM symbol of a frame includes a preamble. When a receiver receives a frame, the signal power of the frame is measured within a cyclic prefix (CP) of the preamble present in the first OFDM symbol of the frame. The gain of the receiver components is set according to the signal power measured based on the preamble in the time domain.

The preamble facilitates signal power measurements due to the following properties of the preamble. The signal power of the preamble is unchanged across the frames. Further, since no data other than the preamble is carried in the first OFDM symbol, the signal power measured based on the preamble does not depend on resource allocation, which can cause variation in signal power measured based on data symbols in the frames. Further, the preamble is a wideband signal with a time-domain signal power variation contained within a ±3 dB range in the CP. Accordingly, any errors in setting the gain and decoding data in the frames are limited to ±3 dB.

Frames of many OFDMA systems such as Long Term Evolution (LTE) systems specified by 3rd Generation Partnership Project (3GPP), however, may not include signals like the preamble in the WiMAX systems. Accordingly, in these systems, the signal power measurements may have to be based on symbols that carry user data. Measuring signal power based on user data presents the following problems.

Depending on the amount of user data carried in the frames, narrow band allocations are likely to occur. Measuring narrow band signal power in a small measurement window (e.g., within CP), however, can cause large errors in signal power measurements. Hence, the signal power must be measured in a larger window (e.g., within a sub-frame or several sub-frames). Additionally, based on the amount of user data, resource allocation across the frames may vary dynamically. Dynamic resource allocation may result in OFDM symbols with varying time-domain symbol powers across the frames. Accordingly, a gain setting derived from signal power measured based on data in one frame may not be suitable for processing a subsequent frame.

Figure 2:
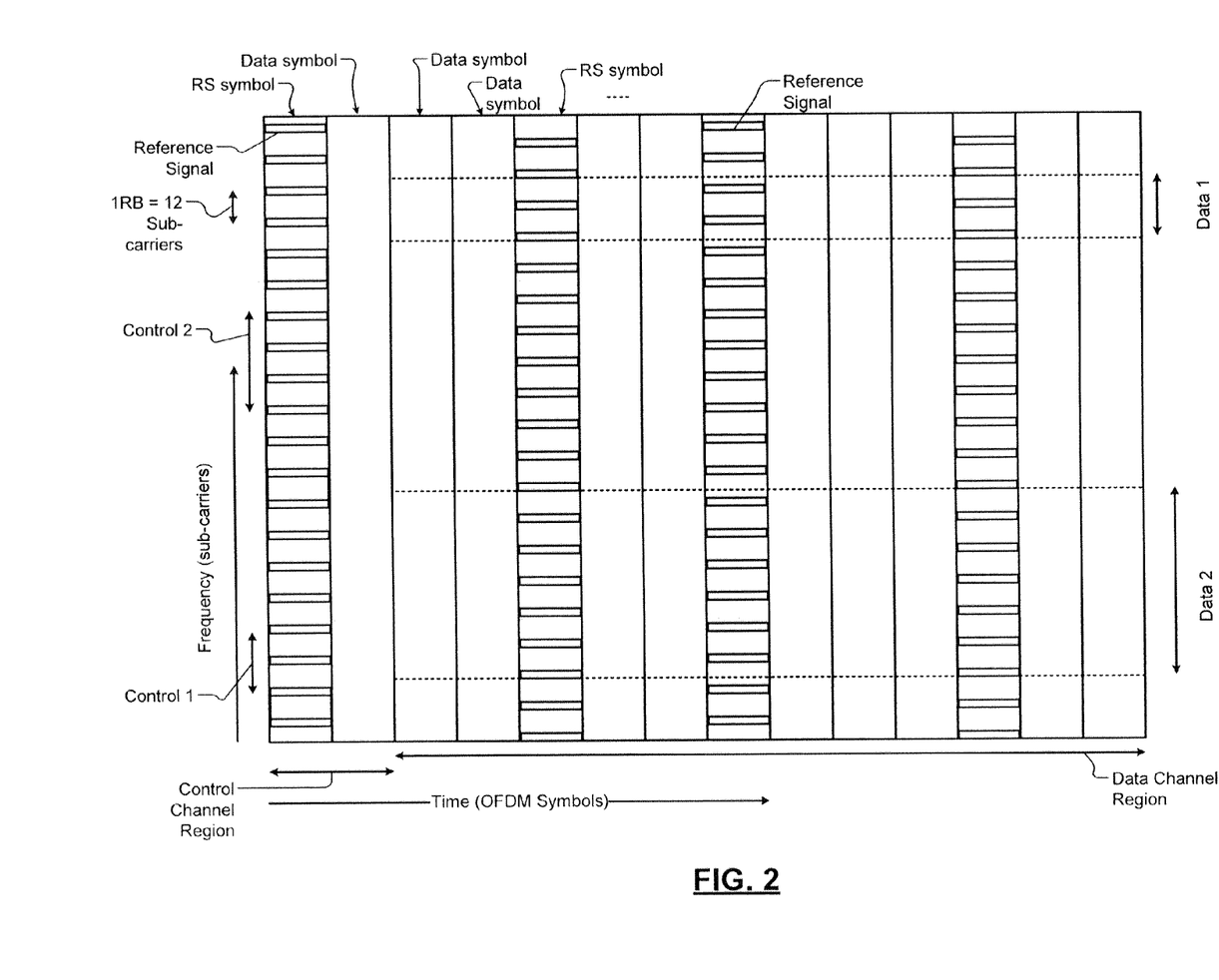
FIG. 2 depicts an example of a long term evolution (LTE) sub-frame.

Referring now to FIG. 2, an example of an LTE sub-frame is shown. Data are located in the LTE sub-frame in increments of one resource block (RB). A resource block includes a predetermined number of sub-carriers (e.g., 1 RB=12 sub-carriers). The LTE sub-frame does not include preamble. Instead, the LTE sub-frame includes reference signals, which are also called pilot signals or pilots. In the example shown, the LTE sub-frame includes two reference signals per resource block (i.e., one reference signal (RS) for every six sub-carriers). The number of reference signals per resource block is proportional to the number of antennas in the receiver.

In the LTE sub-frame, symbols carrying the reference signals and user data are called RS symbols, and symbols carrying user data and no reference signals are called data symbols. An RS symbol includes both reference signals and user data, each occupying different sub-carriers (frequencies). Each LTE sub-frame can include a plurality of RS symbols and a plurality data symbols as shown. In an RS symbol, a ratio of a number of RS sub-carriers (i.e., a number of sub-carriers used to carry the reference signals) in a resource block to a total number of sub-carriers in the resource block is called a reference signal density.

The LTE sub-frame includes a control channel region and a data channel region. A first plurality of symbols in the LTE sub-frame is in the control channel region. A second plurality of symbols in the LTE sub-frame is in the data channel region. In the example shown, two control channels (control 1 and control 2) and two data channels (data 1 and data 2) are allocated in the LTE sub-frame. The control channel 1 (control 1) controls resource allocation of the data channel 1 (data 1), and the control channel 2 (control 2) controls resource allocation of the data channel 2 (data 2). In general, one or more control channels and one or more data channels may be used. Signal power in the control channel region is not representative of the signal power in the data channel region.

Narrow band allocation in OFDMA systems causes large variation in time-domain signal power estimates. Specifically, since signal power varies within a symbol, the signal power measurement may differ depending on a size of a measurement window used to measure the signal power. For example, the signal power measured using a measurement window of size CP/4 can be different than the signal power measured using a measurement window of size CP/2 or 3 CP/4.

In other words, signal power estimation is a function of a window length and signal properties. A small measurement window tends to yield an instantaneous signal power estimate instead of an average signal power estimate. Accordingly, errors in signal power measurement can be pronounced when small measurement windows are used to measure signal power. Data can be lost if gain is set according to erroneous signal power measurements.

Further, even if the number of gain updates is limited to one, and a full CP is used for signal power measurement to reduce the error, the variation in the signal power measurement precludes the AGC module from updating the gain within a CP based on the signal power measured in the current symbol. In other words, without the preamble, signal power cannot be measured reliably based on the first symbol of a sub-frame, and gain to process the sub-frame cannot be set correctly based on the signal power measured during the first symbol of the sub-frame. Specifically, in the time domain, by the time signal power is measured based on the first symbol, the first symbol is lost. Accordingly, signal power must be measured in a previous sub-frame, and gain to process a subsequent sub-frame must be set based on the signal power measured in the previous sub-frame.

Signal power measured in a previous sub-frame, however, cannot be used to set the gain to process a subsequent frame because resource allocation may differ from one frame to another. Consequently, the signal power may also differ from one frame to another. As a result, a gain setting derived from the signal power measured in a previous sub-frame cannot be used to process a subsequent sub-frame.

For example, an empty sub-frame allocation results in empty OFDM symbols, which yield very small power estimates that should be excluded when setting the gain. This, together with the fact that the gain to process a current sub-frame is set based on the signal power measured in a previous sub-frame, precludes symbol by symbol gain adjustment in AGC tracking.

Accordingly, the time domain power measurements should be aggregated over a longer measurement window (e.g., over one or more sub-frames in LTE systems). Combining power measurements of symbols in one or more sub-frames in AGC tracking, however, circumvents power fluctuation from symbol to symbol but does not address power fluctuation from sub-frame to sub-frame due to difference in loading (e.g., empty sub-frame followed by fully loaded sub-frame).

Figure 3A:
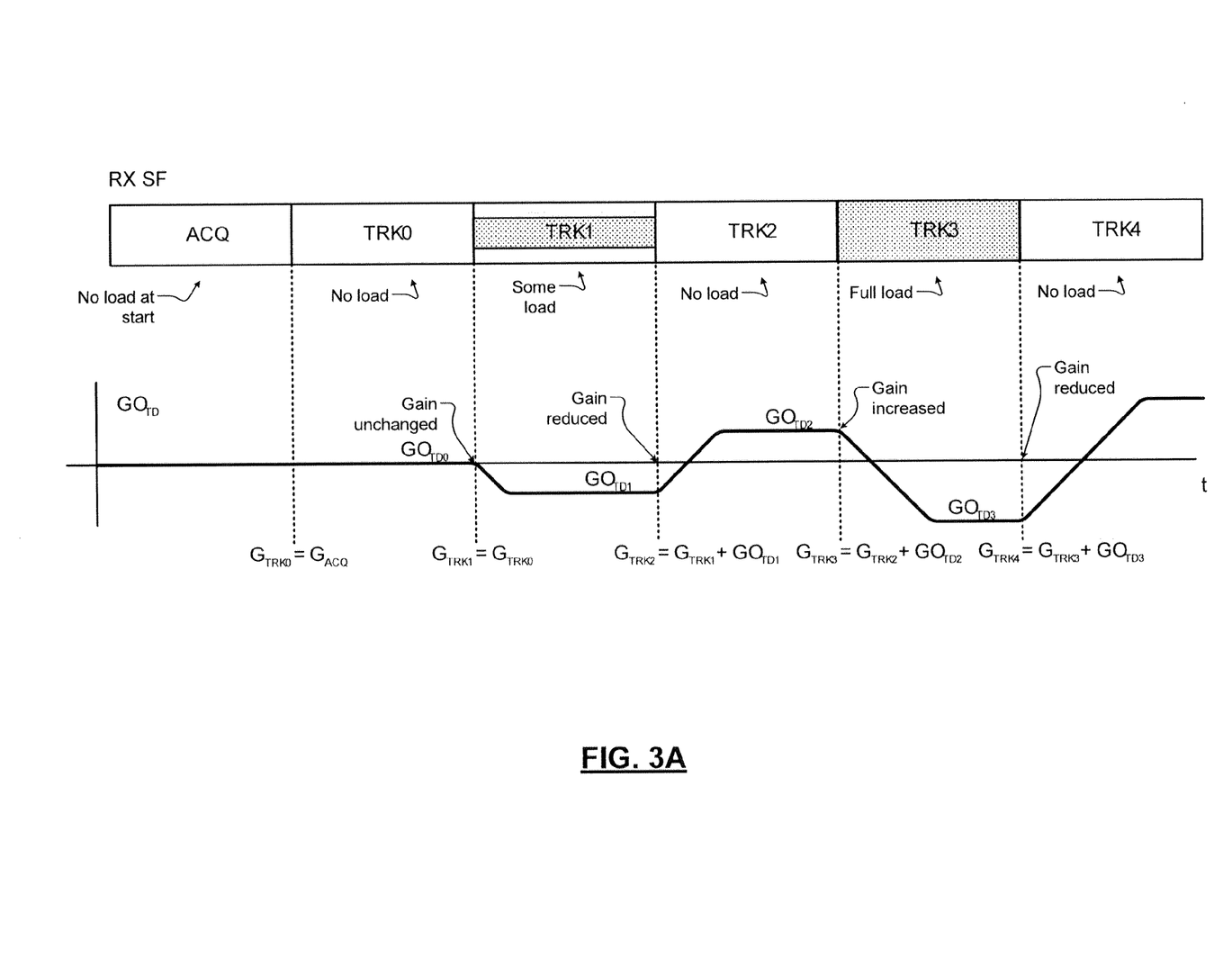
FIGS. 3A and 3B depict examples of gain variation in a receiver when the gain of the receiver components is set based on signal power measured in the time domain.
Figure 3B:
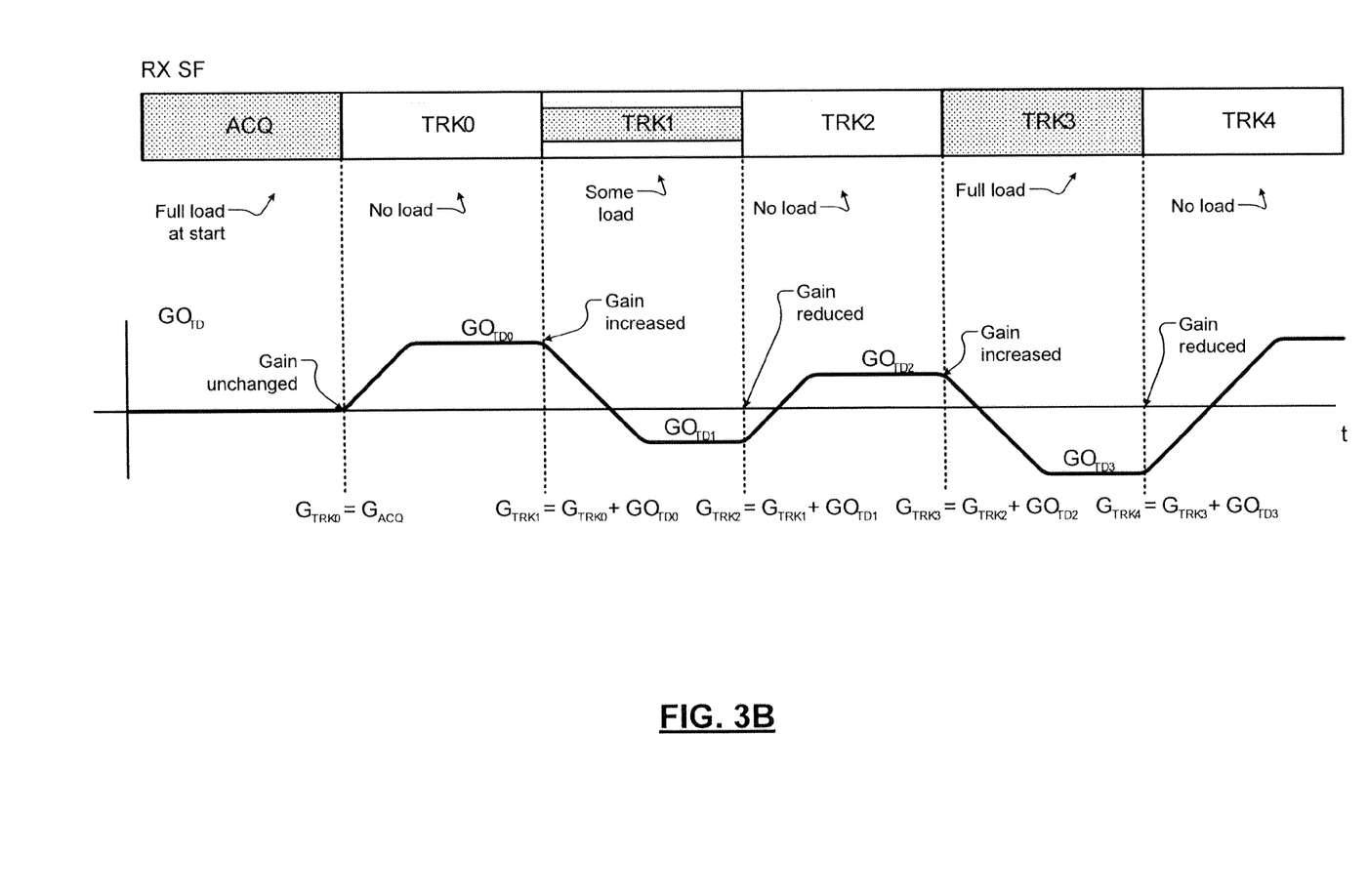

Referring now to FIGS. 3A and 3B, examples of gain variation when gain is set based on a time-domain power measurement from a preceding sub-frame are shown. The examples shown are for gain variation in an AWGN channel (i.e., a channel with no channel gain change) in order to isolate signal power changes due to changes in resource allocation from the changes in channel gains. In the examples, a gain offset (GO) indicates a gain error in a sub-frame.

In FIG. 3A, the AGC module begins gain control with an initial gain setting, and a first sub-frame received is empty (i.e., no load). The AGC module measures signal power in a previous sub-frame and sets the gain to process the following sub-frame based on the signal power measured in the previous sub-frame as shown. Note that the gain variation is worse when an empty sub-frame is followed by a fully loaded sub-frame.

In FIG. 3B, the AGC module begins with an initial gain setting, and a first sub-frame received is full (i.e., full load). The AGC module measures signal power in a previous sub-frame and sets the gain to process the following sub-frame based on the signal power measured in the previous sub-frame as shown. As FIGS. 3A and 3B indicate, different loading of the sub-frames causes large gain variation, and time-domain power measurements alone are insufficient for proper AGC tracking.

The present disclosure relates to measuring signal power based on reference signals (pilots) included in a sub-frame and setting the gain of the receiver components that process the sub-frame based on the signal power measured based on the reference signals in frequency domain. Each sub-frame includes the reference signals at predetermined locations (called resource elements) in time and frequency as shown in FIG. 2. Note that the reference signals are different than a preamble, a cyclic prefix, a guard band, a sub-carrier, a training signal, and user data. Rather, to facilitate channel estimation at the receiver, the reference signals are specifically transmitted with a predetermined signal power that is independent of resource allocation in the sub-frame. Further, the resource signals cover the full bandwidth and are therefore particularly suitable for accurately estimating signal power at the receiver.

Additionally, no extra processing is required at the receiver to extract the reference signals for measuring signal power since the reference signals are automatically extracted by the FFT module of the receiver for channel estimation. Accordingly, the reference signals are readily available for measuring signal power in the frequency domain. The present disclosure relates to measuring the signal power in the frequency domain based on the reference signals and setting the gain of the receiver components based on the frequency domain signal power measurement. The time domain signal power measurement is combined with the frequency domain signal power measurement to set the gain of the receiver components. Both time and frequency domain signal power measurements are used since most wireless receivers operate in presence of blockers (e.g., narrow band blockers, adjacent and non-adjacent channel blockers, etc.), and most RF receivers do not completely filter out signals outside of the channel of interest.

Figure 4A:
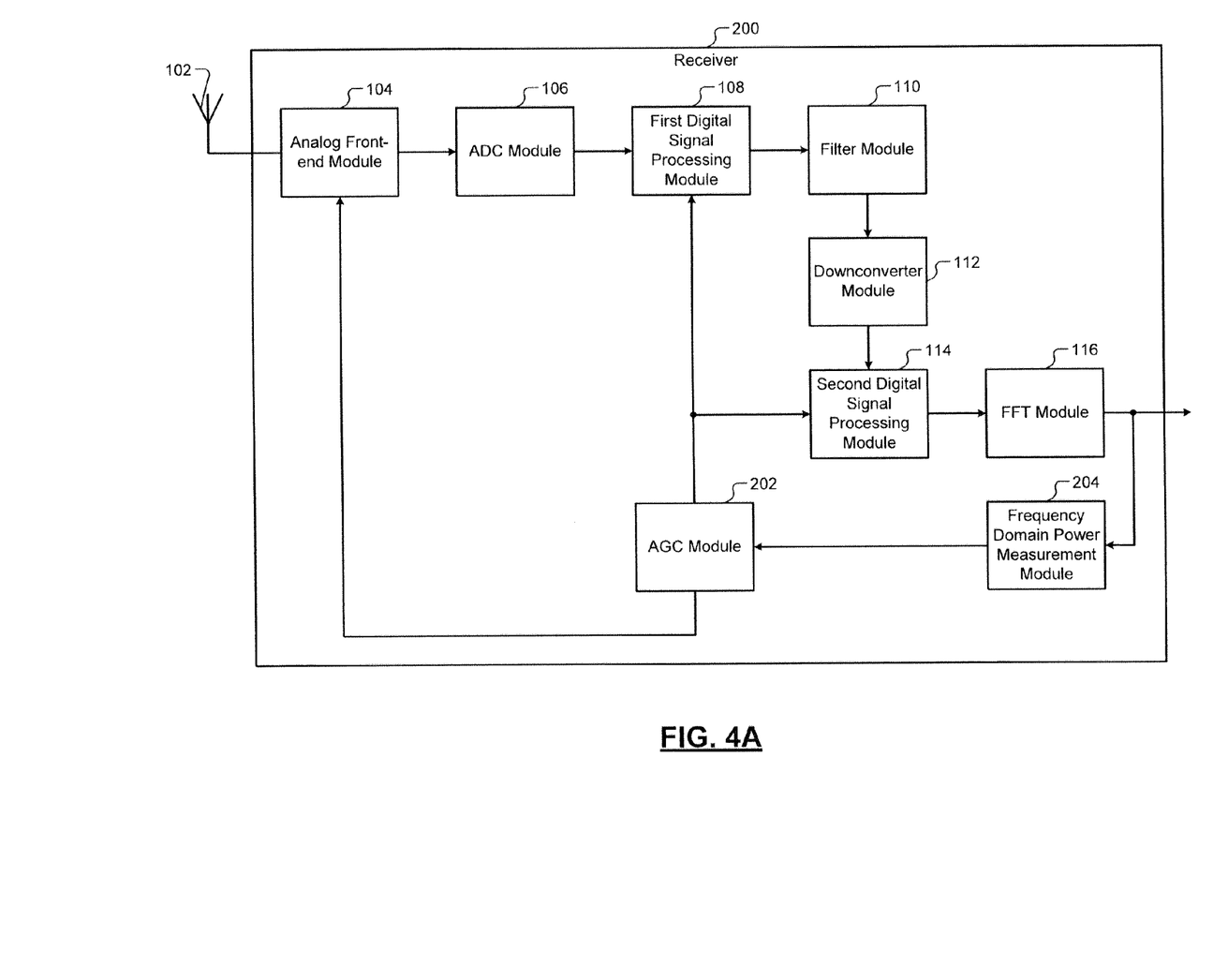
FIG. 4A is a functional block diagram of a receiver that sets the gain of the receiver components based on signal power measured in the frequency domain.

Referring now to FIG. 4A, a receiver 200 of a wireless communication device is shown. The receiver 200 uses AGC to set gain of the receiver components according to signal power measured in the frequency domain. The receiver 200 includes the antenna 102, the analog front-end (AFE) module 104, the analog-to-digital converter (ADC) module 106, the first digital signal processing (DSP) module 108, the filter module 110, the downconverter module 112, the second DSP module 114, the fast Fourier transform (FFT) module 116, an automatic gain control (AGC) module 202, and a frequency domain (FD) power measurement module 204.

The AGC module 202 controls the gain of the AFE module 104, the first DSP module 108, and the second DSP module 114 (collectively referred to as the receiver components). The FD power measurement module 204 measures the signal power of the received signals in frequency domain as explained below and outputs the signal power measurement to the AGC module 202. The AGC module 202 adjusts the gain of the receiver components based on the signal power measurement in frequency domain.

Mathematically, a relationship between time-domain root mean square (RMS) of a received signal and frequency-domain RMS of the received signal can be expressed by the following equation (assuming full loading with equal sub-carrier powers):

$$\text{RMS}_{TD_i}^2 = \frac{1}{N}\sum_{n=0}^{N-1}|y_i(n)|^2 = \frac{1}{N^2}\sum_{k\in\Omega_{sc}}|Y_i(k)|^2 = \frac{1}{\rho_{RS}\cdot N^2}\sum_{k\in\Omega_{RS}}|Y_i(k)|^2$$

In the equation, $y_i(n)$ denotes the received signal in the time domain, and $Y_i(k)$ denotes the received signal in frequency domain. $\rho_{RS}$ denotes a reference signal density (i.e. a ratio of number of RS sub-carriers in a resource block to a total number of sub-carriers in the resource block as defined earlier). For example, in FIG. 2, $\rho_{RS}=\frac{1}{6}$ since two reference signals are used per resource block of 12 sub-carriers (i.e., 1 reference signal is used every six sub-carriers). N denotes FFT size (e.g., N=512, 1024, etc.). $\Omega_{sc}$ denotes a set of sub-carriers used (which may differ from the FFT size), and $\Omega_{RS}$ denotes a set of reference signal sub-carriers. i denotes a receive antenna index (e.g., i can be 0 or 1 for two receive antennas). Note that the signal power equals $\text{RMS}^2$ divided by a termination impedance.

The FD power measurement module 204 measures the frequency-domain RMS of RS sub-carriers for each receive antenna i over RS sub-carriers in each RS symbol m. The FD power measurement module 204 can perform the measurement within a predetermined measurement interval. For example, the predetermined measurement interval can be one or more LTE sub-frames. The FD power measurement module 204 measures the frequency-domain RMS of RS sub-carriers for each receive antenna i over RS sub-carriers in each RS symbol m within the predetermined measurement interval based on the following equation:

$$\text{RMS}_{RS}^2(i,m) = \frac{1}{N^2}\sum_{k\in\Omega_{RS}}|Y_{i,m}(k)|^2$$

Note that the FD power measurement module 204 measures the frequency-domain RMS of RS sub-carriers only based on RS symbols and not based on data symbols (shown in FIG. 2).

The FD power measurement module 204 averages the frequency-domain RMS of RS sub-carriers measured as above over all $N_{RS}$ RS symbols in the predetermined measurement interval using the following equation:

$$\text{RMS}_{RS}^2 = \max_i \frac{1}{N_{RS}}\sum_{m=0}^{N_{RS}-1}\text{RMS}_{RS}^2(i,m)$$

In some systems, a single AGC may control the gain of the receiver components that process signals received via multiple antennas. In such systems, the FD power measurement module 204 finds a maximum of the averaged signal powers measured for the i antennas as indicated above. The FD power measurement module 204 uses the maximum to set the gain of the receiver components.

In systems where a separate AGC is used to set the gain of the receiver components that process signals received via each antenna, the maximum is not used. Instead, the averaged signal power for each antenna calculated as above is used to set the gain of the receiver components associated with the respective antenna.

The AGC module 202 generates a frequency domain gain offset ($\text{GO}_{FD}$), which is an amount by which the AGC module 202 adjusts the gain of the receiver components, using the following equation:

$$GO_{FD} = 10\log_{10}\left(\frac{\text{RMS}_{RS_{target}}^2}{\text{RMS}_{RS}^2}\right)$$

$$\text{RMS}_{RS_{target}}^2 = \rho_{RS}\cdot\text{RMS}_{TD_{target}}^2$$

In the equation, values that are subscripted with the word "target" indicate respective desired values. The AGC module 202 can also determine the gain offset $\text{GO}_{FD}$ using a lookup table.

Setting the gain based on the signal power measured in the time domain ensures a constant total signal power. In contrast, setting the gain based on the signal power measured in frequency domain ensures a constant power spectral density (i.e. constant signal power in frequency domain) regardless of resource allocation. For example, the signal power measured in frequency domain is unchanged regardless of the whether one resource block or 100 resource blocks are allocated in an LTE sub-frame. Accordingly, the output of the FFT module 116 is unchanged even when the output of the time-domain power measurement module 120 changes due to changes in resource allocation.

Figure 4B:
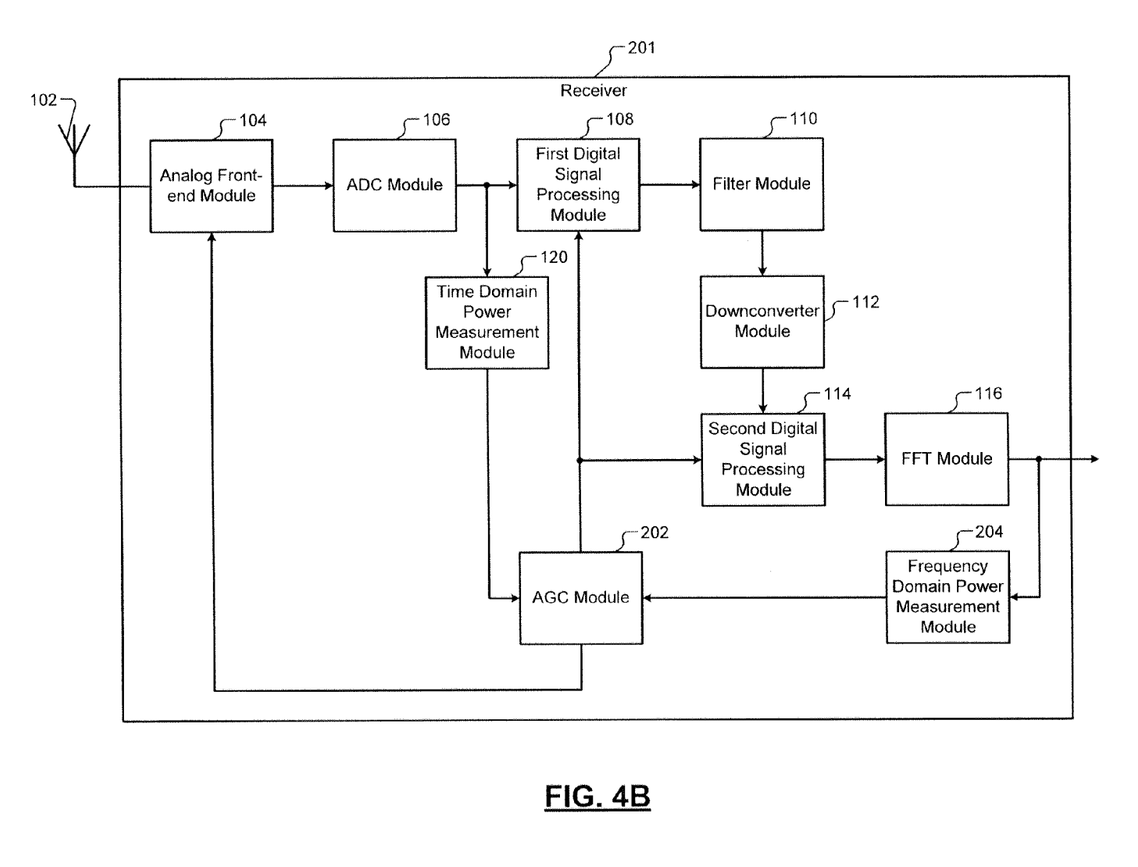
FIG. 4B is a functional block diagram of a receiver that sets the gain of the receiver components based on signal power measured in at least one of the time domain and the frequency domain.

Referring now to FIG. 4B, a receiver 201 of a wireless communication device is shown. The receiver 201 uses AGC to set gain of the receiver components according to signal power measured in frequency domain and the time domain. The receiver 201 includes all the modules of the receiver 200 and additionally includes the time-domain power measurement module 120. Frequency-domain power measurement described above accurately measures power within a desired channel bandwidth and is sufficient if signals outside of desired channel bandwidth (i.e., blockers) are not present. Further, the frequency domain power measurement works equally well on both AWGN and fading channels in the absence of blockers. Blockers from adjacent channels, however, can adversely impact the output of the ADC module 106 if the blockers are not filtered out effectively. Accordingly, the time-domain power measurement should be combined with the frequency-domain power measurement to set the gain of the receiver components.

Specifically, the AGC module 202 should select a minimum of the frequency domain gain offset and the time domain gain offset $\text{GO}_{TD}$ and should use the minimum to set the gain of the receiver components. The AGC module 202 determines the time-domain gain offset $\text{GO}_{TD}$ based on the total signal power in the time domain measured by the time-domain power measurement module 118 and a desired signal power. Combining time and frequency domain power gain offsets is mathematically expressed by the following equation:

$$GO=\min(GO_{TD},GO_{FD})$$

Accordingly, the AGC module 202 will set the gain of the receiver components based on a greater of the frequency-domain power measurement and the time-domain power measurement to minimize the effect of blockers on the output of the ADC module 106.

Figure 5A:
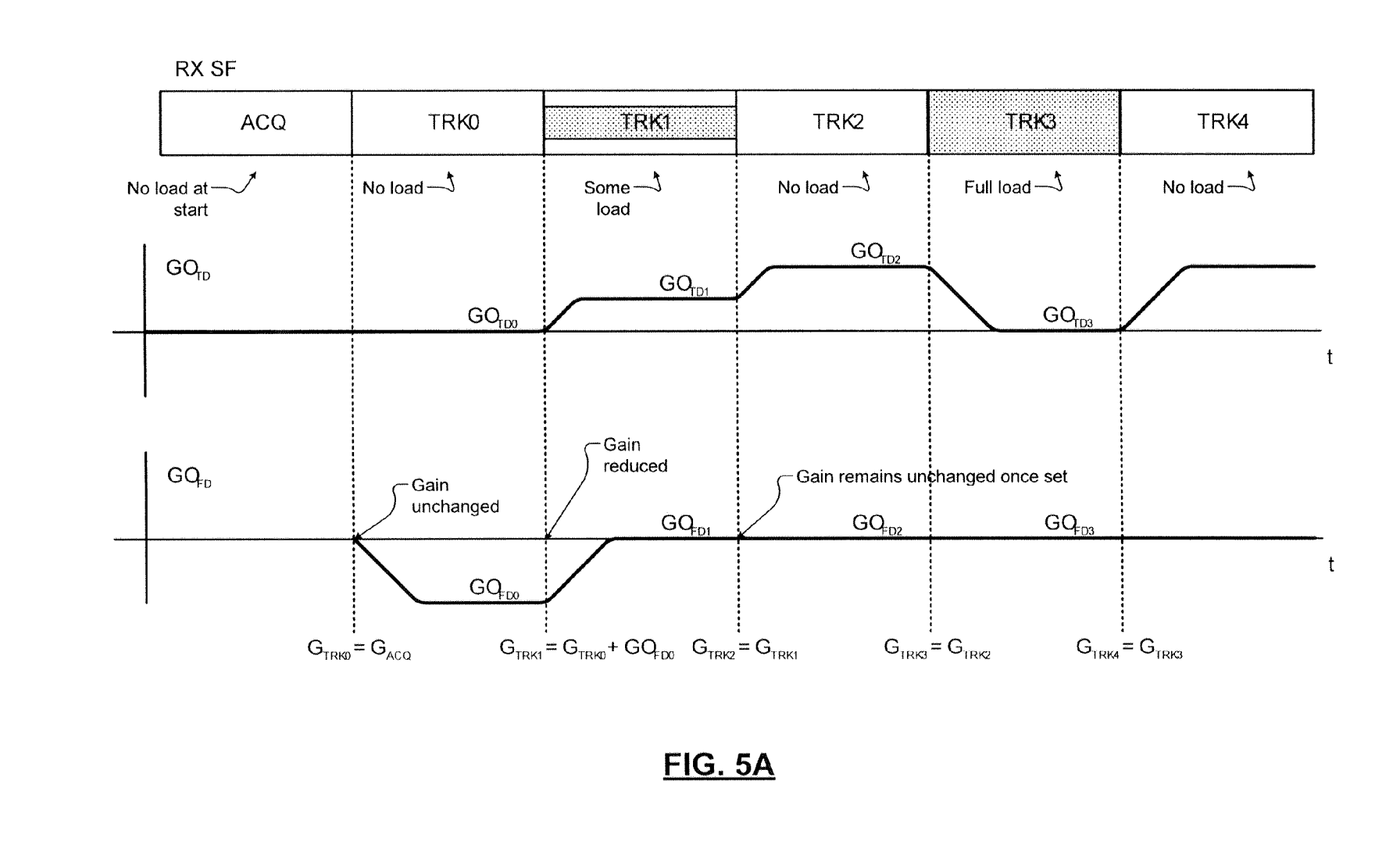
FIGS. 5A and 5B depict examples of gain variation in a receiver when the gain of the receiver components is set based on signal power measured in the frequency domain.
Figure 5B:
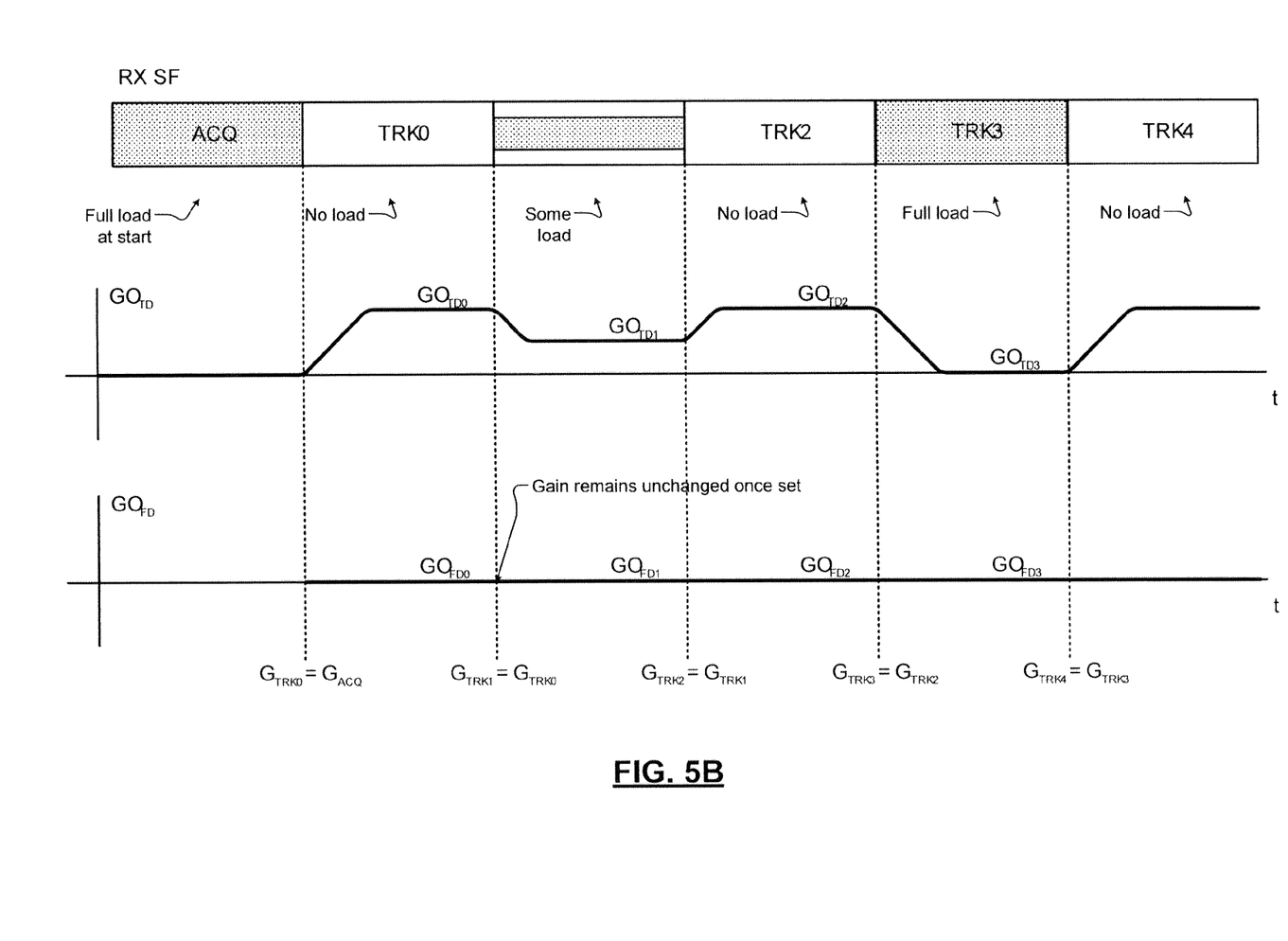

Referring now to FIGS. 5A and 5B, examples of gain variation when gain is set based on a frequency-domain power measurement from a preceding sub-frame are shown. The examples shown are for gain variation in absence of residual blocker power in an additive white Gaussian noise (AWGN) channel (i.e., a channel with no channel gain change) in order to isolate signal power changes due to changes in resource allocation from the changes in channel gains. In FIG. 5A, the AGC module 202 begins with an initial gain setting, and a first sub-frame received is empty (i.e., no load). The AGC module 202 measures signal power in a previous sub-frame in frequency domain based on the reference signals in the sub-frame. Note that the reference signal RMS target defined earlier is selected such that, in absence of residual blocker power, frequency domain gain offset is always equal to the time domain gain offset for fully allocated sub-frame regardless of the actual allocation. Thus, although the first sub-frame received is empty, the AGC module 202 will decrease the gain to a level necessary to process a fully allocated sub-frame as shown.

After the gain is set, assuming blockers are filtered, the AGC module 202 does not need to change the gain to process subsequent sub-frames. This is because the AGC module 202 sets the gain according to signal power measured based on the reference signals independently of resource allocation of the sub-frame in which the signal power is measured. Note that the time-domain gain offset varies but is disregarded when setting the gain (assuming blockers are filtered).

In FIG. 5B, the AGC module 202 begins with an initial gain setting, and a first sub-frame received is full (i.e., full load). The AGC module 202 measures signal power in a previous sub-frame in the frequency domain based on the reference signals in the sub-frame and sets the gain to process the following frame based on the signal power measured in the previous frame as shown. As FIGS. 5A and 5B indicate, different loading of the sub-frames does not causes large gain variation, and the frequency-domain power measurement is sufficient for AGC tracking when blockers are filtered.

In summary, setting the gain of the receiver components by measuring signal power in the frequency domain based on the reference signals eliminates gain fluctuation (errors) due to dynamic resource allocation. This can reduce bit width of receiver data path modules by at least two bits. For example, in LTE systems where gain can vary between 8 dB and 13 dB, precision (i.e., dynamic range) of the ADC module 106 and precision of other time-domain and frequency-domain data processing circuits can be reduced by at least 2 bits, which would be otherwise necessary to provide headroom for gain variation between 8 dB and 13 dB. Further, using time-domain and frequency-domain power measurements to set gain prevents the output of the ADC module 106 from saturating in case of residual blocker leakage.

Figure 6:
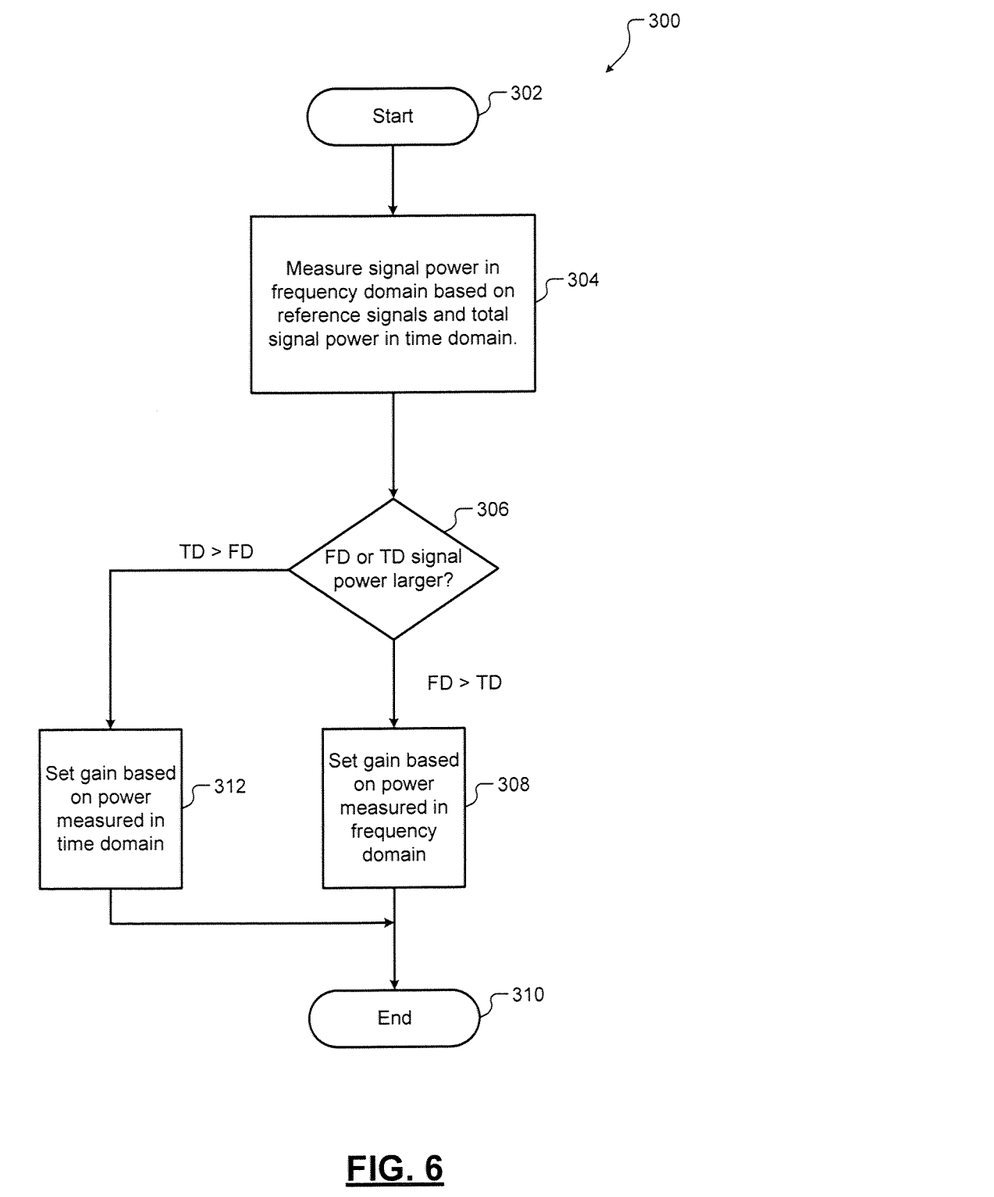
FIG. 6 is a flowchart of a method for setting the gain of the receiver components based on signal power measured in at least one of the time domain and the frequency domain.

Referring now to FIG. 6, a method 300 for setting gain of receiver components of a wireless communication device is shown. Control begins at 302. At 304, control measures signal power in frequency domain based on reference signals in the received signal and the total signal power in the time domain. At 306, control determines if the time or frequency domain signal power is larger. At 308, if the frequency domain signal power is larger, control sets the gain of the receiver components based on the signal power measured in frequency domain based on the reference signals, and control ends at 310. At 312, if the time domain signal power is larger, controls sets the gain of the receiver components based on the signal power measured in the time domain, and control ends at 310.

The teachings of the present disclosure are applicable to all OFDMA systems (e.g., WiMAX, LTE, etc.) since the power measurement and gain setting disclosed herein relies only on reference signals. The teachings can be further extended to other systems that use dynamic resource allocation and that include signals similar to the pilots.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A receiver for a wireless communication device, the receiver comprising:
   a fast Fourier transform module configured to convert a signal from a time domain to a frequency domain,
      wherein the signal includes a plurality of reference signals, and
      wherein the reference signals have a predetermined power;
   a first power measuring module configured to generate a first power measurement of the signal in the frequency domain based on the plurality of reference signals; and
   a gain control module configured to adjust a gain of the receiver based on the first power measurement,
   wherein the first power measuring module is configured to generate the first power measurement during a first frame in the signal, and
   wherein the receiver is configured to process a second frame in the signal subsequent to the first frame at the adjusted gain regardless of resource allocation of frames subsequent to the first frame in the signal.

2. The receiver of claim 1 wherein:
   the reference signals are present in the signal at predetermined locations; and
   the reference signals do not correspond to any one of a preamble, a cyclic prefix, a guard band, a sub-carrier, a training signal, and user data.

3. The receiver of claim 1, further comprising:
   a second power measuring module configured to generate a second power measurement of the signal in the time domain,
   wherein the second power measurement depends on resource allocation used in the signal, and
   wherein the gain control module is configured to adjust the gain of the receiver based on (i) the first power measurement and (ii) the second power measurement.

4. The receiver of claim 1, wherein:
   the signal includes sub-carriers modulated using orthogonal frequency division multiplexing;
   the reference signals are pilot signals transmitted using a predetermined number of the sub-carriers; and
   the receiver is configured to generate a channel estimate based on the reference signals.

5. The receiver of claim 1, further comprising:
   an analog front-end module configured to receive an input signal from an antenna and process the input signal received from the antenna;
   an analog-to-digital converter module configured to convert an output of the analog front-end module from analog to digital format and to generate the signal;
   a first digital signal processing module configured to process an output of the analog-to-digital converter module;
   a filter module configured to filter an output of the first digital signal processing module;
   a downconverter module configured to downconvert an output of the filter module; and a second digital signal processing module configured to process an output of the downconverter module, wherein the fast Fourier transform module receives the signal from the downconverter module, and wherein the gain of the receiver includes gain of at least one of (i) the analog front-end module, (ii) the first digital signal processing module, and (iii) the second digital signal processing module.

6. A receiver for a wireless communication device, the receiver comprising:

a fast Fourier transform module configured to convert a signal from a time domain to a frequency domain,
wherein the signal includes a plurality of reference signals, and
wherein the reference signals have a predetermined power;

a first power measuring module configured to generate a first power measurement of the signal in the frequency domain based on the plurality of reference signals;

a gain control module configured to adjust a gain of the receiver based on the first power measurement; and a second power measuring module configured to generate a second power measurement of the signal in the time domain, wherein the second power measurement depends on resource allocation used in the signal, and wherein the gain control module is configured to adjust the gain of the receiver based on the first power measurement regardless of variation in the second power measurement.

7. The receiver of claim 6, further comprising:

an analog front-end module configured to receive an input signal from an antenna and process the input signal received from the antenna;

an analog-to-digital converter module configured to convert an output of the analog front-end module from analog to digital format and to generate the signal;

a first digital signal processing module configured to process an output of the analog-to-digital converter module;

a filter module configured to filter an output of the first digital signal processing module;

a downconverter module configured to downconvert an output of the filter module; and a second digital signal processing module configured to process an output of the downconverter module, wherein the fast Fourier transform module receives the signal from the downconverter module, and wherein the gain of the receiver includes gain of at least one of (i) the analog front-end module, (ii) the first digital signal processing module, and (iii) the second digital signal processing module.

8. A receiver for a wireless communication device, the receiver comprising:

a fast Fourier transform module configured to convert a signal from a time domain to a frequency domain,
wherein the signal includes a plurality of reference signals, and
wherein the reference signals have a predetermined power;

a first power measuring module configured to generate a first power measurement of the signal in the frequency domain based on the plurality of reference signals; and a gain control module configured to adjust a gain of the receiver based on the first power measurement, wherein the signal includes a plurality of reference signal symbols and a plurality of data symbols;

wherein the first power measuring module is configured to measure a mean square power of a set of the reference signals in each of the reference signal symbols within a measurement interval, generate the first power measurement by averaging the mean square powers of the reference signal symbols, and generate an offset based on the first power measurement and a desired power; and wherein the gain control module is configured to adjust the gain of the receiver based on the offset.

9. The receiver of claim 8, further comprising:

an analog front-end module configured to receive an input signal from an antenna and process the input signal received from the antenna;

an analog-to-digital converter module configured to convert an output of the analog front-end module from analog to digital format and to generate the signal;

a first digital signal processing module configured to process an output of the analog-to-digital converter module;

a filter module configured to filter an output of the first digital signal processing module;

a downconverter module configured to downconvert an output of the filter module; and a second digital signal processing module configured to process an output of the downconverter module, wherein the fast Fourier transform module receives the signal from the downconverter module, and wherein the gain of the receiver includes gain of at least one of (i) the analog front-end module, (ii) the first digital signal processing module, and (iii) the second digital signal processing module.

10. A receiver for a wireless communication device, the receiver comprising:

a fast Fourier transform module configured to convert a signal from a time domain to a frequency domain,
wherein the signal includes a plurality of reference signals, and
wherein the reference signals have a predetermined power;

a first power measuring module configured to generate a first power measurement of the signal in the frequency domain based on the plurality of reference signals;

a gain control module configured to adjust a gain of the receiver based on the first power measurement; and a second power measuring module configured to generate a second power measurement of the signal in the time domain, wherein the second power measurement depends on resource allocation used in the signal, and wherein the gain control module is configured to
generate a first offset based on the first power measurement and a desired power,
generate a second offset based on the second power measurement and the desired power, and
adjust the gain of the receiver based on a smaller of (i) the first offset and (ii) the second offset.

11. The receiver of claim 10, further comprising:

an analog front-end module configured to receive an input signal from an antenna and process the input signal received from the antenna;

an analog-to-digital converter module configured to convert an output of the analog front-end module from analog to digital format and to generate the signal;

a first digital signal processing module configured to process an output of the analog-to-digital converter module;

a filter module configured to filter an output of the first digital signal processing module;

a downconverter module configured to downconvert an output of the filter module; and a second digital signal processing module configured to process an output of the downconverter module, wherein the fast Fourier transform module receives the signal from the downconverter module, and wherein the gain of the receiver includes gain of at least one of (i) the analog front-end module, (ii) the first digital signal processing module, and (iii) the second digital signal processing module.

12. A method for a receiver of a wireless communication device, the method comprising:

converting a signal received by the receiver from a time domain to a frequency domain, wherein the signal includes a plurality of reference signals, and wherein the reference signals have a predetermined power;

generating a first power measurement of the signal in the frequency domain based on the plurality of reference signals;

adjusting a gain of the receiver based on the first power measurement;

generating the first power measurement during a first frame in the signal; and processing a second frame in the signal subsequent to the first frame at the adjusted gain regardless of resource allocation of frames subsequent to the first frame in the signal.

13. The method of claim 12, wherein:

wherein the reference signals are present in the signal at predetermined locations; and the reference signals do not correspond to any one of a preamble, a cyclic prefix, a guard band, a sub-carrier, a training signal, and user data.

14. The method of claim 12, further comprising:

generating a second power measurement of the signal in the time domain, wherein the second power measurement depends on resource allocation used in the signal; and adjusting the gain of the receiver based on (i) the first power measurement and (ii) the second power measurement.

15. The method of claim 12, wherein the signal includes sub-carriers modulated using orthogonal frequency division multiplexing, and wherein the reference signals are pilot signals transmitted using a predetermined number of the sub-carriers, the method further comprising:

generating a channel estimate based on the reference signals.

16. A method for a receiver of a wireless communication device, the method comprising:

converting a signal received by the receiver from a time domain to a frequency domain, wherein the signal includes a plurality of reference signals, wherein the reference signals have a predetermined power, and wherein the signal includes (i) a plurality of reference signal symbols and (ii) a plurality of data symbols;

generating a first power measurement of the signal in the frequency domain based on the plurality of reference signals;

adjusting a gain of the receiver based on the first power measurement;

measuring a mean square power of a set of the reference signals in each of the reference signal symbols within a measurement interval;

generating the first power measurement by averaging the mean square powers of the reference signal symbols;

generating an offset based on the first power measurement and a desired power; and adjusting the gain of the receiver based on the offset.

17. The method of claim 16, wherein the signal includes sub-carriers modulated using orthogonal frequency division multiplexing, and wherein the reference signals are pilot signals transmitted using a predetermined number of the sub-carriers, the method further comprising:

generating a channel estimate based on the reference signals.

18. A method for a receiver of a wireless communication device, the method comprising:

converting a signal received by the receiver from a time domain to a frequency domain, wherein the signal includes a plurality of reference signals, and wherein the reference signals have a predetermined power;

generating a first power measurement of the signal in the frequency domain based on the plurality of reference signals;

adjusting a gain of the receiver based on the first power measurement;

generating a second power measurement of the signal in the time domain, wherein the second power measurement depends on resource allocation used in the signal;

generating a first offset based on the first power measurement and a desired power;

generating a second offset based on the second power measurement and the desired power; and adjusting the gain of the receiver based on a smaller of (i) the first offset and (ii) the second offset.

19. The method of claim 18, wherein the signal includes sub-carriers modulated using orthogonal frequency division multiplexing, and wherein the reference signals are pilot signals transmitted using a predetermined number of the sub-carriers, the method further comprising:

generating a channel estimate based on the reference signals.

20. A method for a receiver of a wireless communication device, the method comprising:

converting a signal received by the receiver from a time domain to a frequency domain, wherein the signal includes a plurality of reference signals, and wherein the reference signals have a predetermined power;

generating a first power measurement of the signal in the frequency domain based on the plurality of reference signals;

adjusting a gain of the receiver based on the first power measurement;

generating a second power measurement of the signal in the time domain, wherein the second power measurement depends on resource allocation used in the signal; and adjusting the gain of the receiver based on the first power measurement regardless of variation in the second power measurement.

* * * * *